United States Patent
Cao

(10) Patent No.: US 11,817,141 B2
(45) Date of Patent: Nov. 14, 2023

(54) REFRESH CONTROL CIRCUIT AND MEMORY

(71) Applicant: CHANGXIN MEMORY TECHNOLOGIES, INC., Hefei (CN)

(72) Inventor: Xianlei Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

(21) Appl. No.: 17/453,890

(22) Filed: Nov. 8, 2021

(65) Prior Publication Data
US 2022/0293161 A1 Sep. 15, 2022

Related U.S. Application Data

(63) Continuation of application No. PCT/CN2021/107433, filed on Jul. 20, 2021.

(30) Foreign Application Priority Data

Mar. 15, 2021 (CN) .......................... 202110277822.4

(51) Int. Cl.
*G11C 11/406* (2006.01)
*G11C 11/408* (2006.01)

(52) U.S. Cl.
CPC .......... *G11C 11/406* (2013.01); *G11C 11/408* (2013.01)

(58) Field of Classification Search
CPC ............................................... G11C 14/40611
See application file for complete search history.

(56) References Cited

U.S. PATENT DOCUMENTS

| 9,336,852 B2 | 5/2016 | Lim et al. |
| 9,570,143 B2 | 2/2017 | Lim et al. |

(Continued)

FOREIGN PATENT DOCUMENTS

| CN | 104795097 A | 7/2015 |
| CN | 106128498 A | 11/2016 |

(Continued)

OTHER PUBLICATIONS

International Search Report cited in PCT/CN2021/105218 dated Dec. 15, 2021, 10 pages.

(Continued)

*Primary Examiner* — Jason Lappas
(74) *Attorney, Agent, or Firm* — Cooper Legal Group, LLC

(57) ABSTRACT

The present disclosure provides a refresh control circuit and a memory. The refresh control circuit includes: a random capture module, configured to sequentially receive n single row addresses and randomly output m single row addresses among the n single row addresses, wherein the n>the m>1; a row hammer address generation module, connected to an output terminal of the random capture module, configured to analyze a single row address with highest frequency of occurrence among the m single row addresses, and configured to output a row hammer address corresponding to the single row address with highest frequency of occurrence; and a signal selector, configured to receive a conventional refresh address and the row hammer address and output address information, the address information being the row hammer address and the conventional refresh address, or the address information being the row hammer address.

14 Claims, 1 Drawing Sheet

(56) References Cited

U.S. PATENT DOCUMENTS

| | | | |
|---|---|---|---|
| 9,978,440 B2 | 5/2018 | Cho | |
| 10,811,077 B2 | 10/2020 | Shin et al. | |
| 10,818,336 B2 | 10/2020 | Alzheimer | |
| 10,860,222 B2 | 12/2020 | Shin et al. | |
| 10,861,530 B2 | 12/2020 | Yamada et al. | |
| 10,950,288 B2 | 3/2021 | Nale et al. | |
| 2015/0243338 A1 | 8/2015 | Sohn et al. | |
| 2016/0099043 A1 | 4/2016 | Tu | |
| 2018/0005690 A1 | 1/2018 | Morgan et al. | |
| 2019/0066759 A1 | 2/2019 | Nale | |
| 2020/0265888 A1* | 8/2020 | Ito | G11C 11/40611 |

FOREIGN PATENT DOCUMENTS

| | | |
|---|---|---|
| CN | 108885892 A | 11/2018 |
| CN | 110473577 A | 11/2019 |
| CN | 110491430 A | 11/2019 |
| CN | 111145806 A | 5/2020 |
| CN | 111755047 A | 10/2020 |
| CN | 112767983 A | 5/2021 |
| CN | 112786087 A | 5/2021 |
| WO | 2016083865 A1 | 6/2016 |

OTHER PUBLICATIONS

International Search Report cited in PCT/CN2021/120355 dated Dec. 9, 2021, 9 pages.
International Search Report cited in PCT/CN2021/107433 dated Dec. 15, 2021, 11 pages.

* cited by examiner

REFRESH CONTROL CIRCUIT AND MEMORY

CROSS-REFERENCE TO RELATED APPLICATIONS

This is a continuation of International Application No. PCT/CN2021/107433, filed on Jul. 20, 2021, which is based on and claims the priority to Chinese Patent Application 202110277822.4, titled "REFRESH CONTROL CIRCUIT AND MEMORY" and filed on Mar. 15, 2021. The entire contents of International Application No. PCT/CN2021/107433 and Chinese Patent Application 202110277822.4 are incorporated herein by reference.

TECHNICAL FIELD

The present disclosure relates to, but not limited to, a refresh circuit and a memory.

BACKGROUND

With the increasing density of semiconductor memory devices, the memory units are characterized by reduced physical size, decreased stored charges and reduced anti-noise tolerance, the electromagnetic interaction between memory units has a greater impact on the memory units, and the possibility of data loss of the memory cells is increased.

Specifically, when the word line corresponding to a certain single row address in a memory unit is frequently turned on, the leakage rate of capacitors of adjacent addresses (generally called "row hammer address") may be higher the natural leakage rate, resulting in the data loss of the capacitors of adjacent addresses due to excessive charge loss before the arrival of refresh signal. This situation is generally called "raw hammer effect". In order to suppress the row hammer effect, it is necessary to give in-time refresh commands to the row hammer address to replenish charges, thereby avoiding the occurrence of errors in the stored data.

SUMMARY

The following is the summary of the subject described in detail in the present disclosure. This summary is not intended to limit the protection scope defined by the claims.

The present disclosure provides a refresh control circuit and a memory.

A first aspect of the present disclosure provides a refresh control circuit, comprising: a random capture module, configured to sequentially receive n single row addresses and randomly output m single row addresses among the n single row addresses, wherein the n>the m>1; a row hammer address generation module, connected to an output terminal of the random capture module, configured to analyze a single row address with highest frequency of occurrence among the m single row addresses, and configured to output a row hammer address corresponding to the single row address with highest frequency of occurrence; and a signal selector, configured to receive a conventional refresh address and the row hammer address and output address information, the address information being the row hammer address and the conventional refresh address, or the address information being the row hammer address, the address information being used as a refresh object corresponding to a refresh command.

A second aspect of the present disclosure provides a memory, comprising the refresh control circuit described in the first aspect.

Other aspects will become apparent upon reading and understanding the drawings and detailed description.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, like reference numerals denote like elements. The drawings to be described hereinafter are some but not all of the embodiments of the present disclosure. Those skilled in the art can obtain other drawings according to these drawings without paying any creative effort.

DETAILED DESCRIPTION

The technical solutions in the embodiments of the present disclosure will be described clearly and completely with reference to the drawings in the embodiments of the present disclosure. Apparently, the embodiments to be described are only some but not all of the embodiments of the present disclosure. All other embodiments obtained on the basis of the embodiments in the present disclosure by those skilled in the art without paying any creative effort shall fall into the protection scope of the present disclosure. It is to be noted that the embodiments of the present disclosure and the features in the embodiments can be arbitrarily combined with each other if not conflicted.

Figure 1:
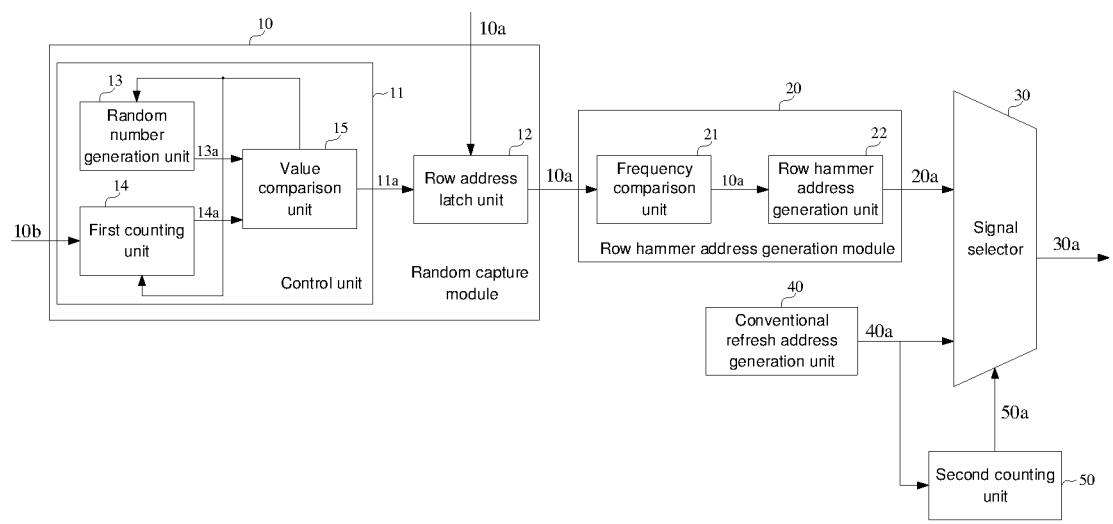
FIG. 1 is a functional structure diagram of a refresh control circuit according to an embodiment of the present application.

Referring to FIG. 1, the refresh control circuit comprises: a random capture module 10, configured to sequentially receive n single row addresses 10a and randomly output m single row addresses 10a among the n single row addresses 10a, wherein n>m>1; a row hammer address generation module 20, connected to an output terminal of the random capture module 10 and configured to analyze a single row address 10a with the highest frequency of occurrence among the m singe row addresses 10a and output a row hammer address 20a corresponding to the single row address 10a with the highest frequency of occurrence; and, a signal selector 30, configured to receive a conventional refresh address 40a and the row hammer address 20a and output address information 30a, the address information 30a being the row hammer address 20a and the conventional refresh address 40a, or the address information 30a being the row hammer address 20a, the address information 30a being used as a refresh object corresponding to a refresh command.

The random capture module 10 performs random output operations to reduce the number of address samples. That is, the address samples are decreased from n single row addresses 10a to m single row addresses 10a. When the row hammer address generation module 20 analyzes the single row address 10a with the highest frequency of occurrence on the basis of the address samples, the address samples contains a smaller number of single row addresses 10a, so that it is advantageous to improve the analysis rate of the row hammer address generation module 20 and reduce the occupation of computing resources by the row hammer address generation module 20 during the analysis process.

In addition, in the case of receiving a row hammer address 20a and a conventional refresh address 40a, at least the row hammer address 20a is outputted without sequentially refreshing according to the defaulted refresh sequence of the conventional refresh address 40a, so that the preferential refreshing of the row hammer address 20a is realized, the data loss of the capacitor corresponding to the row hammer address 20a before the arrival of a refresh signal due to excessive charge loss is avoided, and it is advantageous to ensure the accuracy of data storage.

In this embodiment, the random capture module 10 comprises: a control unit 11, configured to generate and output trigger signals 11a at m random time points; and a row address latch unit 12, configured to receive each of the n single row addresses 10a one by one, and receive each of the trigger signals 11a outputted by the control unit 11 one by one, to output m single row addresses 10a corresponding to the m trigger signals 11a, and output the last received single row address 10a before the arrival of the outputted trigger signal 11a if the trigger signal 11a is received.

After the row address latch unit 12 receives a single row address 10a, this single row address 10a is reserved. If the row address latch unit 12 receives a trigger signal 11a before receiving a next single row address 10a, the single row address 10a is latched and outputted; and, if the row address latch unit 12 firstly receives a next single row address 10a, the reserved single row address 10a is discarded, and the next single row address 10a is reserved.

In this embodiment, the control unit 11 comprises: a random number generation unit 13, configured to generate and output a random positive integer 13a; a first counting unit 14, configured to receive n row activation commands 10b one by one, and count the number of the received row activation commands 10b, to output a first count value 14a; wherein each of the row activation commands 10b corresponding to one single row address 10a, the n row activation commands 10b corresponding to the n single row addresses 10a; and a value comparison unit 15, connected to an input terminal of the row address latch unit 12, and configured to receive the random positive integer 13a and the first count value 14a, and output the trigger signal 11a and reset the random number generation unit 13 and the first counting unit 14 if the first count value 14a is equal to the random positive integer 13a, so that the random number generation unit 13 generates and outputs a new random positive integer 13a and the first counting unit 14 starts counting again from zero.

The n row activation commands 10b refer to row activation commands 10b received by the memory between adjacent refresh commands, and the n single row addresses 10a refer to the addresses of word lines corresponding to the n row activation commands 10b. The n row activation commands 10b may include repetitive row activation commands 10b, and the n single row addresses 10a may include repetitive single row addresses 10a.

In this embodiment, the random positive integer 13a is less than or equal to 20. Thus, it is advantageous to ensure that the randomly outputted m single row addresses 10a have a certain number of samples, the influence on the representativeness of the output result of the random capture module 10 due to too few samples is avoided, and it is advantageous to accurately refresh the row hammer address 20a.

In this embodiment, the row hammer address generation module 20 comprises: a frequency comparison unit 21, connected to an output terminal of the random capture module 10, at least configured to analyze and output the single row address 10a with the highest frequency of occurrence among the m single row addresses 10a; and a row hammer address generation unit 22, configured to receive the single row address 10a with the highest frequency of occurrence and output the row hammer address 20a corresponding to the single row address 10a with the highest frequency of occurrence.

The frequency comparison unit 21 outputs the single row address 10a with the highest frequency of occurrence before the arrival of the refresh command. When each single row address 10a among the m single row addresses 10a is unique, that is, the single row address 10a does not appear repeatedly, the frequency comparison unit 21 randomly outputs a single row address 10a. When the single row addresses 10a with the highest frequency of occurrence among the m single row addresses 10a comprise at least two parallel single row addresses 10a, a single row address 10a is randomly output from the at least two parallel single row addresses 10a.

In other embodiments, the frequency comparison unit is configured to analyze and output signal row addresses with the first i frequencies of occurrence among the m single row addresses, wherein i>1. Thus, it is advantageous to suppress the errors caused by random output, it is ensured that the outputted single row addresses include the single row address with the highest frequency of occurrence among the n single row addresses, and the accurate refreshing of row hammer addresses is realized. If the actual number of the single row addresses ranked in the first i places is greater than i due to parallel existence, i single row addresses are randomly outputted from the single row addresses ranked in the first i places, or high-ranked non-repetitive single row addresses ranked in the front are firstly outputted and the remaining number of single row addresses are randomly outputted from a plurality of low-ranked single row addresses in parallel, or all single row addresses ranked in the first i places are outputted.

It is to be noted that, the value of i may be a fixed value or a varying value. The single row addresses ranked in the first i places refer to single row addresses having a frequency of occurrence greater than the preset frequency, and the value of i is equal to the number of single row addresses having a frequency of occurrence greater than the preset frequency. When the frequency of occurrence of a single row address is greater than the preset frequency, data storage errors may occur in the word line pointed by an adjacent single row address. Thus, the frequency comparison unit outputs all row hammer addresses where data storage errors may occur, and the data storage errors are avoided as far as possible.

Figure 2:
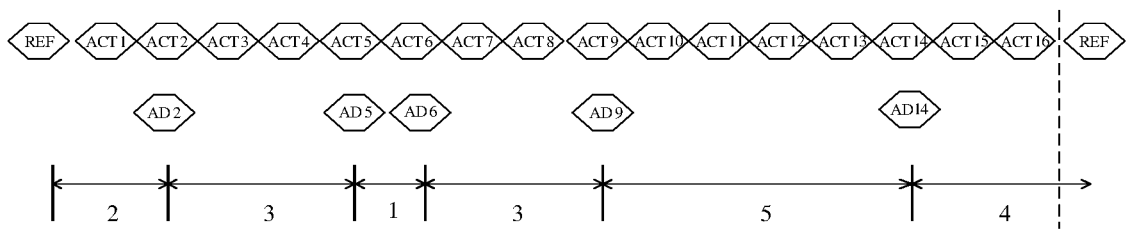
FIG. 2 is a schematic diagram of the operation principle of the refresh control circuit according to an embodiment of the present application.

The operation principles of the random capture module 10 and the row hammer address generation module 20 will be described in detail below by specific examples. Referring to FIGS. 1 and 2:

In FIG. 2, there are a plurality of row activation commands 10b (ACT1-ACT16) between adjacent refresh commands RFE. Each row activation command 10b corresponds to one single row address 10a (indicated by ADx, wherein x refers to the serial number). For example, ACT2 corresponds to AD2, ACT5 corresponds to AD5, ACT6 corresponds to AD6, ACT9 corresponds to AD9, and ACT14 corresponds to AD14.

If it is assumed that the initial first count value 14a of the first counting unit 14 is 0, that is, counting starts from zero, and if the first random positive integer 13a generated by the random number generation unit 13 is 2, upon receiving the second row activation command 10b, the first counting unit 14 outputs a first count value 14a equal to the first random positive integer 13a. At this time, the value comparison unit 15 outputs a trigger signal 11a and resets the random number generation unit 13 and the first counting unit 14, so that the random number generation unit 13 generates a second random positive integer 13a and the first counting unit 14 starts counting again from zero, that is, the first count value 14a returns to zero. When the first counting unit 14 receives the second row activation command 10b, the row address latch unit 12 receives and reserves the second single row address 10a, i.e., AD2. When the value comparison unit 15 outputs a trigger signal 11a, the row address latch unit 12 latches and outputs the second single row address 10a.

If it is assumed that the second random positive integer 13a generated by the random number generation unit 13 is 3, when the first counting unit 14 receives three row activation commands 10b again, i.e., the fifth row activation command 10b, the first count value 14a is equal to the second random positive integer 13a again, the value comparison unit 15 outputs the second trigger signal 11a, and the random number generation unit 13 and the first counting unit 14 are reset for the second time. When the first counting unit 14 receives the fifth row activation command 10b, the row address latch unit 12 receives the fifth single row address 10a, i.e., AD5. When the value comparison unit 15 outputs the second trigger signal 11a, the row address latch unit 12 latches and outputs the fifth single row address 10a.

In such a cycle, if it is assumed that the third random positive integer 13a generated by the random number generation unit 13 is 1, when the first counting unit 14 receives the sixth row activation command 10b, the value comparison unit 15 outputs the third trigger signal 11a, and the row address latch unit 12 latches and outputs the sixth single row address 10a, i.e., AD6. If it is assumed that the fourth random positive integer 13a is 3, the row address latch unit 12 latches and outputs the ninth single row address 10a, i.e., AD9. If it is assumed that the fifth random positive integer 13a is 5, the row address latch unit 12 latches and outputs the fourteenth single row address 10a, i.e., AD14.

It is to be noted that, when the random positive integer 13a generated by the random number generation unit 13 is greater than the number of the remaining row activation commands 10b before the arrival of the refresh command REF, the first count value 14a finally outputted by the first counting unit 14 is kept after the arrival of the refresh command REF. For example, if the number of the remaining row activation commands 10b before the arrival of the refresh command REF is 2 (i.e., the remaining ACT15 and ACT16) and the sixth random positive integer 13a is 4, during the execution of the refresh command REF, the first count value 14a outputted by the first counting unit 14 is 2, and the first count value 14a is kept after the execution of the refresh command REF. That is, after the refresh command REF is executed, the first counting unit 14 starts counting from 2.

In this embodiment, the row hammer address 20a is adjacent address of the single row address 10a outputted by the frequency comparison unit 21. For example, if the single row address 10a is x, x is a positive integer, the row hammer address 20a includes a first single row address and a second single row address, wherein the first single row address is x−1 and the second single row address is x+1. It is to be noted that the row hammer address 20a is the collective name of the adjacent address and has a unit of "group". One group of row hammer address 20a may include one or more adjacent addresses of a single row address 10a. In some embodiments, the row hammer address includes only x+1 or x−1, or further includes at least one of x+2 or x−2.

The function of the signal selector 30 after receiving the row hammer address 20a is mainly discussed herein. That is, the output address information at least includes the row hammer address 20a, so that the preferential refreshing of the row hammer address 20a is realized. The function of the refresh control circuit before receiving the row hammer address 20a (i.e., refreshing according to the defaulted refresh sequence of conventional refresh address) belongs to the content already known by those skilled in the art, and is only briefly described herein.

In this embodiment, the detailed description will be given by taking the signal selector 30 receiving only one group of row hammer address 20a before the arrival of the refresh command REF, one group of row hammer address 20a including two adjacent addresses, and the signal selector 30 outputting j−2 conventional refresh address 40a and then two adjacent addresses as an actual output mode as an example.

In other embodiments, the signal selector receives one or multiple groups of row hammer address, and each group of row hammer address contains one or more adjacent addresses. The actual output mode of the signal selector is described below: each conventional refresh address is received and outputted before the row hammer address is received; the conventional refresh address is stopped outputting after the row hammer address is received; and, each conventional refresh address is continuously received and outputted after the row hammer address is outputted.

In this embodiment, the signal selector 30 is further configured to receive a selection signal 50a, and successively receive and output new conventional refresh address 40a before receiving the selection signal 50a, and stop outputting the conventional refresh address 40a and successively receive and output the row hammer address 20a after receiving the selection signal 50a, wherein the selection signal 50a indicates that the signal selector 30 has received j−2 conventional refresh address 40a, where j is the number of refresh rows corresponding to each refresh command, and j>2.

In other embodiments, the selection signal indicates that the signal selector has received j−q conventional refresh address, where j>q, and q is obtained by multiplying the number of groups of row hammer address outputted by the signal selector by the number of adjacent addresses contained in each group of row hammer address.

In this embodiment, the refresh control circuit further comprises: a second counting unit 50, configured to count the number of the conventional refresh address 40a received by the signal selector 30 to obtain a second count value, and output the selection signal 50a if the second count value is equal to j−2.

It can be known that, the selection signal 50a is an identification signal outputted by the second counting unit 50 and set to switch the signal selector 30 to receive the row hammer address 20a and the conventional refresh address 40a, so that the path between the signal selector 30 and the conventional refresh address generation unit 40 is turned off and the path between the signal selector 30 and the row hammer address generation unit 22 is turned on, thereby receiving and outputting row hammer address 20a. In addition, the identification signal may be the numerical value of the second count value.

In this embodiment, after the signal selector 30 outputs the conventional refresh address 40a and the row hammer address 20a, exactly, after j−2 conventional refresh address 40a and one group of row hammer address 20a are outputted, the second counting unit 50 is reset to stop outputting the selection signal 50a and the second counting unit is controlled to count again from zero to wait for the arrival of the next refresh command REF, so that the above output steps are repeated. That is, j−2 conventional refresh address 40a is outputted firstly, and one group of row hammer address 20a is then outputted.

In this embodiment, the second counting unit 50 is further configured to write and update the value of j−2. After the value of j−2 is updated and if the second count value is equal to the updated j−2, the selection signal 50a is outputted. Thus, it is advantageous to update the value of j−2 in real time according to the policy of outputting row hammer address 20a by the signal selector 30, and it is ensured that the refreshing of row hammer address 20a can be completed in fresh rows corresponding to the refresh command or all the refresh rows corresponding to the refresh command are used to refresh row hammer address 20a.

In this embodiment, the refresh control circuit further comprises: a conventional refresh address generation unit 40, configured to generate and output at least one conventional refresh address 40a, an output terminal of the conventional refresh address generation unit 40 being connected to an input terminal of the signal selector 30 and an input terminal of the second counting unit 50, respectively, the second counting unit 50 being configured to receive the at least one conventional refresh address 40a outputted by the conventional refresh address generation unit 40.

In this embodiment, in the case of receiving a row hammer address and a conventional refresh address, at least the row hammer address is outputted without sequentially refreshing according to the defaulted refresh sequence of the conventional refresh address, so that the preferential refreshing of the row hammer address is realized, the data loss of the capacitor corresponding to the row hammer address before the arrival of refresh signal due to excessive charge loss is avoided, and the accuracy of data storage is ensured. In addition, by reducing the analysis samples of single row addresses in a random output mode, malicious programs can be avoided from copying the output mode and refreshing the row hammer address, and it is advantageous to improve the refresh efficiency and ensure the timely refreshing of the row hammer address.

An embodiment of the present disclosure further provides a memory, comprising the refresh control circuit described above. According to the memory, by preferentially refreshing row hammer address, the data loss of the capacitor corresponding to the row hammer address before the arrival of refresh signal due to excessive charge loss is avoided, and the accuracy of data storage of the memory is improved. Meanwhile, by reducing the analysis samples of single row addresses in a random output mode, malicious programs can be avoided from copying the output mode and refreshing the row hammer address, and it is advantageous to improve the refresh efficiency and ensure the timely refreshing of the row hammer address.

Various embodiments or implementations in this specification have been described progressively, and each embodiment focuses on the differences from other embodiments, so the same and similar parts of the embodiments may refer to each other.

In the description of this specification, the description with reference to terms "an embodiment", "an exemplary embodiment", "some embodiments", "an illustrative implementation" or "an example" means that specific features, structures, materials or characteristics described with reference to an implementation or example are included in at least one implementation or example of the present disclosure.

In this specification, the schematic expressions of the terms do not necessarily refer to the same implementation or example. In addition, the described specific features, structures, materials or characteristics may be combined in any one or more implementations or examples in a proper way.

In the description of the present disclosure, it should be understood that the orientation or position relationship indicated by terms "center", "upper", "lower", "left", "right", "vertical", "horizontal", "inner", "outer" and the like is an orientation or position relationship illustrated on the basis of the drawings, and is only for describing the present disclosure and simplifying the description, rather than indicating or implying that the specified device or element must have a particular direction and be constructed and operated in a particular direction. Therefore, the terms cannot be interpreted as limitations to the present disclosure.

It should be understood that the terms such as "first" and "second" used in the present disclosure can be used in the present disclosure to describe various structures, but these structures are not limited by these terms. The terms are only used to distinguish a first structure from another structure.

Throughout one or more drawings, the same elements are denoted by similar reference numerals. For clarity, many parts in the drawings are not drawn to scale. In addition, some known parts may not be shown. For simplicity, the structures obtained after several steps can be described in one drawing. Many specific details of the present disclosure are described hereinafter, for example, the structures, materials, sizes, processing processes and technologies of the devices, in order to understand the present disclosure more clearly. As will be understood by those skilled in the art, the present disclosure may be implemented without these specific details.

Finally, it is to be noted that the foregoing embodiments are only used for describing the technical solutions of the present disclosure, rather than limiting the present disclosure. Although the present disclosure has been described in detail by the foregoing embodiments, a person of ordinary skill in the art should understood that modifications can still be made to the technical solutions recorded in the foregoing embodiments or equipment replacements can be made to some or all of the technical features, and these modifications or replacements do not make the essence of the corresponding technical solutions depart from the scope of the technical solutions in the embodiments of the present disclosure.

INDUSTRIAL APPLICABILITY

In the refresh control circuit and the memory according to the embodiments of the present disclosure, m single row addresses are randomly outputted from n sequentially received single row addresses, and the m single row addresses are analyzed to obtain a single row address with the highest frequency of occurrence. Since n>m, by random output operations, the number of address samples used for analysis can be decreased, and the analysis efficiency can be improved. In the case of receiving a row hammer address and a conventional refresh address, at least the row hammer address is outputted without sequentially refreshing according to the defaulted refresh sequence of the conventional refresh address, so that the preferential refreshing of the row hammer address is realized, the data loss of the capacitor corresponding to the row hammer address before the arrival of refresh signal due to excessive charge loss is avoided, and it is advantageous to ensure the accuracy of data storage. In addition, since the random positive integer is less than or equal to 20, it is advantageous to ensure that the randomly outputted m single row addresses have a certain number of samples, and the influence on the representativeness of the output result due to too few samples is avoided. Thus, the proportional relationship of different single row addresses in the output result is close to the proportional relationship of different single row addresses among the n single row addresses, and it is advantageous to accurately obtain and refresh row hammer address.

The invention claimed is:

1. A refresh control circuit, comprising:
   a random capture module, configured to sequentially receive n single row addresses and randomly output m single row addresses among the n single row addresses, wherein the n>the m>1;
   a row hammer address generation module, connected to an output terminal of the random capture module, configured to analyze a single row address with highest frequency of occurrence among the m single row addresses, and configured to output a row hammer address corresponding to the single row address with highest frequency of occurrence; and
   a signal selector, configured to receive a conventional refresh address and the row hammer address and output address information, the address information being the row hammer address and the conventional refresh address, or the address information being the row hammer address, the address information being used as a refresh object corresponding to a refresh command.

2. The refresh control circuit according to claim 1, wherein the random capture module comprises:
   a control unit, configured to generate and output trigger signals at m random time points; and
   a row address latch unit, configured to receive each of the n single row addresses one by one, and receive each of the trigger signals outputted by the control unit one by one, to output the m single row addresses corresponding to the m trigger signals, and output a last received single row address before arrival of the trigger signal if the trigger signal is received.

3. The refresh control circuit according to claim 2, wherein the control unit comprises:
   a random number generation unit, configured to generate and output a random positive integer;
   a first counting unit, configured to receive n row activation commands one by one, and count a number of the received row activation commands, to output a first count value; wherein each of the row activation commands corresponds to one single row address, the n row activation commands correspond to the n single row addresses; and
   a value comparison unit, connected to an input terminal of the row address latch unit, configured to receive the random positive integer and the first count value, and output the trigger signal and reset the random number generation unit and the first counting unit if the first count value is equal to the random positive integer, so that the random number generation unit generates and outputs a new random positive integer and the first counting unit starts counting again from zero.

4. The refresh control circuit according to claim 3, wherein the random positive integer is less than or equal to 20.

5. The refresh control circuit according to claim 1, wherein the row hammer address generation module comprises:
   a frequency comparison unit, connected to the output terminal of the random capture module, at least configured to analyze and output the single row address with highest frequency of occurrence among the m single row addresses; and
   a row hammer address generation unit, configured to receive the single row address with highest frequency of occurrence, and output the row hammer address corresponding to the single row address with highest frequency of occurrence.

6. The refresh control circuit according to claim 5, wherein the frequency comparison unit is configured to analyze and output single row addresses with first i frequencies of occurrence among the m single row addresses, wherein the i>1.

7. The refresh control circuit according to claim 1, wherein the single row address is x, the x is a positive integer; the row hammer address corresponding to the single row address comprises: a first single row address, the first single row address being x−1; a second single row address, the second single row address being x+1.

8. The refresh control circuit according to claim 1, wherein the signal selector is further configured to receive a selection signal, and successively receive and output each of the conventional refresh addresses before receiving the selection signal, and stop outputting the conventional refresh address and receive and output the row hammer address after receiving the selection signal;
   wherein the selection signal indicates that the signal selector has received j−2 conventional refresh address, j is a number of refresh rows corresponding to each of the refresh commands, and the j>2.

9. The refresh control circuit according to claim 8, further comprising: a second counting unit, configured to count a number of the conventional refresh address received by the signal selector, and obtain a second count value, and output the selection signal if the second count value is equal to the j−2.

10. The refresh control circuit according to claim 9, after the signal selector outputs the conventional refresh address and the row hammer address, the second counting unit is reset so that the selection signal is stopped outputting and the second counting unit is controlled to count again from zero.

11. The refresh control circuit according to claim 9, wherein the second counting unit is further configured to write and update a value of the j−2, and output the selection signal if the second count value is equal to the updated j−2.

12. The refresh control circuit according to claim 9, further comprising: a conventional refresh address generation unit, configured to generate and output at least one of the conventional refresh addresses, an output terminal of the conventional refresh address generation unit being connected to an input terminal of the signal selector and an input terminal of the second counting unit, respectively, the second counting unit being configured to receive the at least one of the conventional refresh addresses outputted by the conventional refresh address generation unit.

13. The refresh control circuit according to claim 1, before receiving the row hammer address, the signal selector receives and outputs each of the conventional refresh addresses; if the row hammer address is received, the signal selector stops outputting the conventional refresh address and outputs each of the received row hammer addresses; the signal selector continuously receives and outputs each of the conventional refresh addresses after the row hammer address is output.

14. A memory, comprising the refresh control circuit according to claim 1.

* * * * *